US012622072B2

(12) United States Patent
Kato

(10) Patent No.: US 12,622,072 B2
(45) Date of Patent: May 5, 2026

(54) SEMICONDUCTOR PHOTODETECTOR

(71) Applicant: Sumitomo Electric Industries, Ltd., Osaka (JP)

(72) Inventor: Takashi Kato, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 404 days.

(21) Appl. No.: 18/242,659

(22) Filed: Sep. 6, 2023

(65) Prior Publication Data

US 2024/0113244 A1      Apr. 4, 2024

(30) Foreign Application Priority Data

Sep. 30, 2022    (JP) ................................. 2022-157888

(51) Int. Cl.
*H10F 30/223*        (2025.01)
*H10F 77/124*        (2025.01)

(52) U.S. Cl.
CPC ....... *H10F 30/223* (2025.01); *H10F 77/1248* (2025.01)

(58) Field of Classification Search
CPC ... H10F 30/223; H10F 77/1248; H10F 77/146
See application file for complete search history.

(56) References Cited

U.S. PATENT DOCUMENTS

| | | | | |
|---|---|---|---|---|
| 4,792,832 A | * | 12/1988 | Baba .................. | H10D 62/8164 257/E29.247 |
| 5,436,468 A | * | 7/1995 | Nakata .............. | H01L 21/02546 257/14 |
| 5,719,895 A | * | 2/1998 | Jewell ................. | H01S 5/34313 257/18 |

(Continued)

FOREIGN PATENT DOCUMENTS

| | | |
|---|---|---|
| CN | 113972292 A | 1/2022 |
| JP | 2016-092037 A | 5/2016 |
| WO | 2012-002144 A1 | 1/2012 |

OTHER PUBLICATIONS

Rubin Sidhu, et al., "A Long-Wavelength Photodiode on InP Using Lattice-Matched GaInAs—GaAsSb Type-II Quantum Wells" IEEE Photonics Technology Letters, vol. 17, No. 12, Dec. 2005, p. 2715 to 2717.

(Continued)

*Primary Examiner* — Sitaramarao S Yechuri
(74) *Attorney, Agent, or Firm* — Volpe Koenig

(57)            ABSTRACT

A semiconductor photodetector includes a first group III-V semiconductor layer of a first conductivity type; a second group III-V semiconductor layer of a second conductivity type; and an optical absorption layer disposed between the first group III-V semiconductor layer and the second group III-V semiconductor layer in a first direction. The optical absorption layer includes a plurality of unit structures stacked in the first direction. Each of the plurality of unit structures includes a gallium arsenide layer, an indium arsenide layer, and a gallium arsenide antimonide layer. The gallium arsenide layer and the indium arsenide layer each have a thickness smaller than a thickness of the gallium arsenide antimonide layer.

14 Claims, 8 Drawing Sheets

(56) References Cited

U.S. PATENT DOCUMENTS

| | | | |
|---|---|---|---|
| 2008/0179589 A1* | 7/2008 | Svensson | H10F 77/146 |
| | | | 438/98 |
| 2013/0002141 A1* | 1/2013 | Lee | H05B 45/48 |
| | | | 315/193 |
| 2013/0099203 A1 | 4/2013 | Akita et al. | |

OTHER PUBLICATIONS

Baile Chen, et al., "SWIR/MWIR InP-Based p-i-n Photodiodes with InGaAs/GaAsSb Type-II Quantum Wells" IEEE Journal of Quantum Electronics, vol. 47, No. 9, Sep. 2011, p. 1244 to 1250.

* cited by examiner

SEMICONDUCTOR PHOTODETECTOR

CROSS REFERENCE TO RELATED APPLICATIONS

This application claims priority based on Japanese Patent Application No. 2022-157888 filed on Sep. 30, 2022, and the entire contents of the Japanese patent application are incorporated herein by reference.

TECHNICAL FIELD

The present disclosure relates to a semiconductor photo-detector.

BACKGROUND

Non-PTL 1 discloses a photodiode comprising an optical absorption layer provided on an n-type indium phosphide (InP) substrate. The optical absorption layer has 150 pairs of type-II superlattices. One pair includes a gallium indium arsenide (GaInAs) layer and a gallium arsenide antimonide (GaAsSb) layer. With this photodiode, a cut-off wavelength (a wavelength of the optical absorption edge) of 2.39 µm is obtained.

Non-PTL 2 discloses a photodiode comprising an optical absorption layer provided on an n-type InP substrate. The optical absorption layer has 100 pairs of type-II superlattices. One pair includes a GaInAs layer and a GaAsSb layer. The optical absorption layer has a strain-compensated quantum well structure.

Non-PTL 1: Rubin Sidhu, et al, "A Long-Wavelength Photodiode on InP Using Lattice-Matched GaInAs—GaAsSb Type-II Quantum Wells" IEEE PHOTONICS TECHNOLOGY LETTERS, VOL. 17, NO. 12, DECEMBER 2005, p. 2715 to 2717

Non-PTL 2: Baile Chen, et al, "SWIR/MWIR InP-Based p-i-n Photodiodes with InGaAs/GaAsSb Type-II Quantum Wells" IEEE JOURNAL OF QUANTUM ELECTRONICS, VOL. 47, NO. 9, SEPTEMBER 2011, p. 1244 to 1250

SUMMARY

A semiconductor photodetector according to one aspect of the present disclosure includes a first group III-V semiconductor layer of a first conductivity type; a second group III-V semiconductor layer of a second conductivity type; and an optical absorption layer disposed between the first group III-V semiconductor layer and the second group III-V semiconductor layer in a first direction. The optical absorption layer includes a plurality of unit structures stacked in the first direction. Each of the plurality of unit structures includes a gallium arsenide layer, an indium arsenide layer, and a gallium arsenide antimonide layer. The gallium arsenide layer and the indium arsenide layer each have a thickness smaller than a thickness of the gallium arsenide antimonide layer.

DETAILED DESCRIPTION

Figure 1:
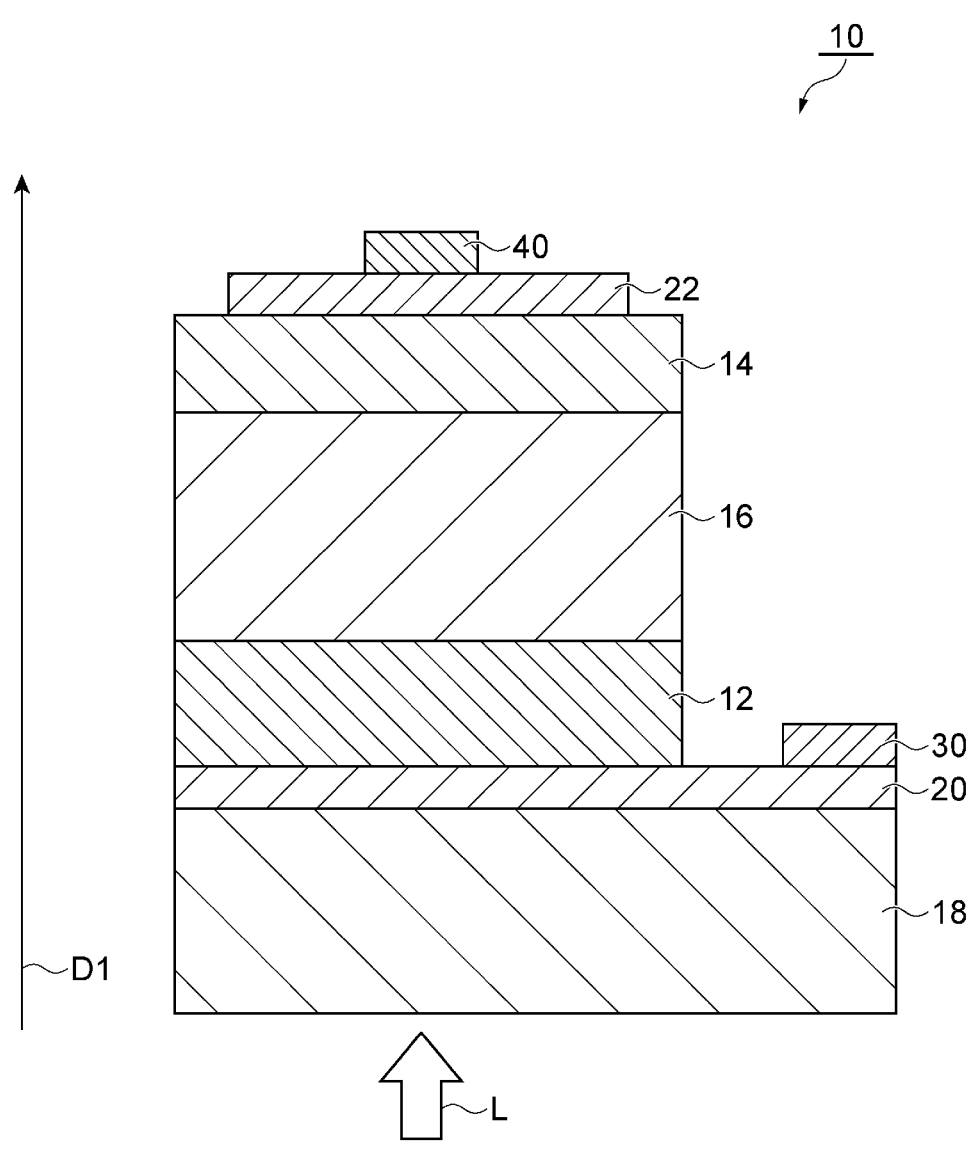
FIG. 1 is a schematic cross-sectional view illustrating a semiconductor photodetector according to an embodiment.

The present disclosure provides a semiconductor photo-detector having a long wavelength of the optical absorption edge.

Description of Embodiments of Present Disclosure

First, embodiments of the present disclosure will be listed and explained.

(1) A semiconductor photodetector according to one aspect of the present disclosure includes a first group III-V semiconductor layer of a first conductivity type; a second group III-V semiconductor layer of a second conductivity type; and an optical absorption layer disposed between the first group III-V semiconductor layer and the second group III-V semiconductor layer in a first direction. The optical absorption layer includes a plurality of unit structures stacked in the first direction. Each of the plurality of unit structures includes a gallium arsenide layer, an indium arsenide layer, and a gallium arsenide antimonide layer. The gallium arsenide layer and the indium arsenide layer each have a thickness smaller than a thickness of the gallium arsenide antimonide layer.

According to the semiconductor light-receiving element, a wavelength of the optical absorption edge can be made longer than in the case where the electronic well layer in each unit structure is composed only of a GaInAs layer. This is considered to be because the eigenenergy of the wave function of the conduction band in the electronic well layer is different.

(2) In (1), each of the plurality of unit structures may further include a gallium indium arsenide layer. The gallium arsenide layer and the indium arsenide layer may be disposed between the gallium indium arsenide layer and the gallium arsenide antimonide layer in the first direction. In this case, the lattice strain caused by the gallium arsenide layer and the indium arsenide layer can be canceled by adjusting the gallium fraction in the gallium indium arsenide layer. Therefore, the average amount of the strain in the electronic well layer can be reduced.

(3) In (2), the gallium indium arsenide layer may have a gallium fraction of 0.4 to 0.55.

(4) In (2) or (3), the gallium indium arsenide layer may have a thickness of 0.8 nm to 2.1 nm.

(5) In any one of (1) to (4), the gallium arsenide layer may have a thickness of 0.2 nm to 1.5 nm.

(6) In any one of (1) to (5), the indium arsenide layer may have a thickness of 0.2 nm to 1.6 nm.

(7) In any one of (1) to (6), the gallium arsenide antimonide layer may have a thickness of 2.5 nm to 6.3 nm.

(8) In any one of (1) to (7), in each of the plurality of unit structures, the number of pairs including the gallium arsenide layer and the indium arsenide layer may be 1 to 10.

(9) In any one of (1) to (8), the gallium arsenide antimonide layer may have an arsenic fraction of 0.45 to 0.6.

(10) In any one of (1) to (9), the semiconductor photodetector may further include an indium phosphide substrate. The first group III-V semiconductor layer may be disposed between the indium phosphide substrate and the optical absorption layer in the first direction.

Details of Embodiments of Present Disclosure

Hereinafter, embodiments of the present disclosure will be described in detail with reference to the accompanying drawings. In the description of the drawings, the same reference numerals are used for the same or equivalent elements, and redundant description is omitted.

FIG. 1 is a schematic cross-sectional view illustrating a semiconductor photodetector according to an embodiment. A semiconductor photodetector 10 shown in FIG. 1 includes a first group III-V semiconductor layer 12 of a first conductivity type, a second group III-V semiconductor layer 14 of a second conductivity type, and an optical absorption layer 16. The first conductivity type is, for example, n-type. The second conductivity type is opposite to the first conductivity type. The second conductivity type is, for example, p-type. Optical absorption layer 16 is non-doped. Semiconductor photodetector 10 is, for example, a photodiode. Optical absorption layer 16 is disposed between first group III-V semiconductor layer 12 and second group III-V semiconductor layer 14 in a first direction D1. First direction D1 is a thickness direction of optical absorption layer 16. First direction D1 may be a direction from first group III-V semiconductor layer 12 toward second group III-V semiconductor layer 14. First direction D1 may be a crystal growth direction. Alternatively, first direction D1 may be a direction from second group III-V semiconductor layer 14 toward first group III-V semiconductor layer 12. First direction D1 may be a direction opposite to the crystal growth direction.

First group III-V semiconductor layer 12 may be an indium phosphide (InP) layer. The dopant concentration in first group III-V semiconductor layer 12 may be $1 \times 10^{23}$ m$^{-3}$ to $1 \times 10^{24}$ m$^{-3}$. First group III-V semiconductor layer 12 may have a thickness of 0.1 µm to 1 µm. Examples of n-type dopants include silicon (Si), tellurium (Te), and tin (Sn).

Second group III-V semiconductor layer 14 may be an InP layer. The dopant concentration in second group III-V semiconductor layer 14 may be $1 \times 10^{23}$ m$^{-3}$ to $1 \times 10^{24}$ m$^{-3}$. Second group III-V semiconductor layer 14 may have a thickness of 0.1 µm to 1 µm. Examples of p-type dopants include zinc (Zn) and beryllium (Be).

Semiconductor photodetector 10 may further include a substrate 18. Substrate 18 may be a III-V semiconductor substrate such as an InP substrate. Substrate 18 may be a semi-insulating substrate. In first direction D1, first group III-V semiconductor layer 12 may be disposed between substrate 18 and optical absorption layer 16. First group III-V semiconductor layer 12 may be disposed on a principal surface of substrate 18. The principal surface of substrate 18 may be a (100) plane. The principal surface of substrate 18 may be orthogonal to first direction D1.

Semiconductor photodetector 10 may further include a group III-V semiconductor layer 20 of the first conductivity type. Group III-V semiconductor layer 20 is disposed between first group III-V semiconductor layer 12 and substrate 18 in first direction D1. Group III-V semiconductor layer 20 may be a contact layer. Group III-V semiconductor layer 20 may be an InP layer. An electrode 30 may be connected to group III-V semiconductor layer 20.

Semiconductor photodetector 10 may further include a group III-V semiconductor layer 22 of the second conductivity type. In first direction D1, second group III-V semiconductor layer 14 is disposed between group III-V semiconductor layer 22 and optical absorption layer 16. Group III-V semiconductor layer 22 may be a contact layer. Group III-V semiconductor layer 22 may be a $Ga_z In_{1-z} As$ layer (also referred to as a GaInAs layer), where z is a gallium (Ga) fraction and z is greater than 0 and less than 1. An electrode 40 may be connected to group III-V semiconductor layer 22.

Semiconductor photodetector 10 can detect incident light L. Incident light L may be visible light or infrared light having a wavelength of 0.4 µm to 3 µm. Incident light L may travel in first direction D1. Incident light L may be incident on optical absorption layer 16 through substrate 18. Semiconductor photodetector 10 may be used in a spectroscopic system of a gas analyzer, an imaging system or an optical communication system.

Figure 2:
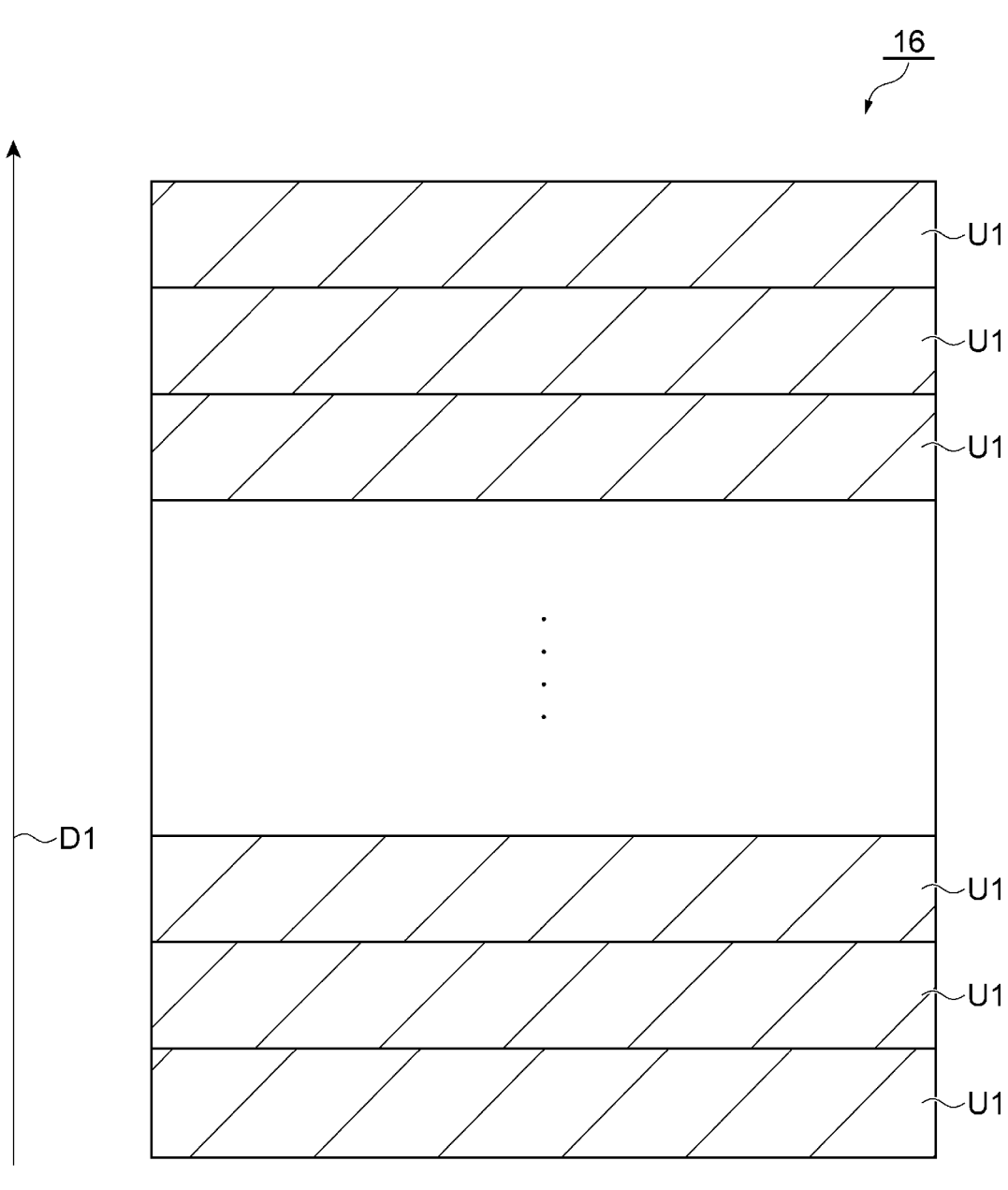
FIG. 2 is a schematic cross-sectional view illustrating an optical absorption layer included in the semiconductor photo-detector of FIG. 1.

FIG. 2 is a schematic cross-sectional view illustrating an optical absorption layer included in the semiconductor photodetector of FIG. 1. As shown in FIG. 2, optical absorption layer 16 includes a plurality of unit structures U1 stacked in first direction D1. The adjacent unit structures U1 may be in contact with each other. The number of unit structures U1 may be 100 to 500. The plurality of unit structures U1 constitute a superlattice.

Figure 3:
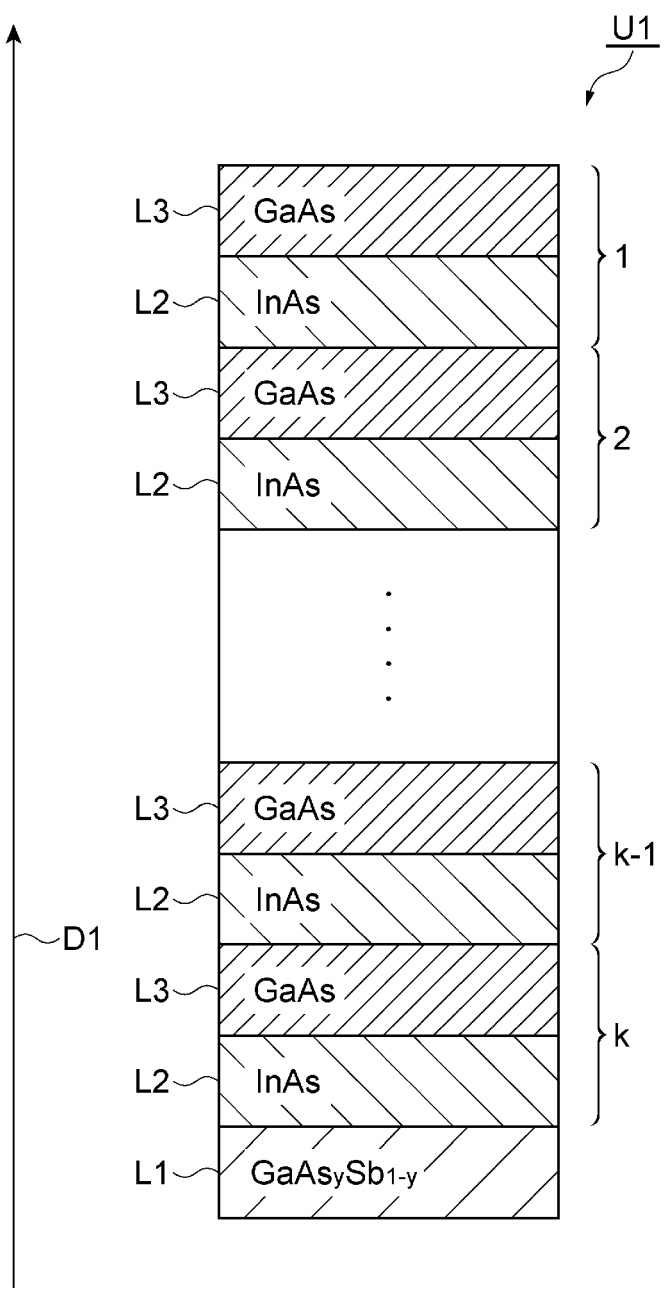
FIG. 3 is a schematic cross-sectional view illustrating a unit structure included in the optical absorption layer of FIG. 2.

FIG. 3 is a schematic cross-sectional view illustrating a unit structure included in the optical absorption layer of FIG. 2. As shown in FIG. 3, each unit structure U1 includes a gallium arsenide antimonide ($GaAs_y S_{1-y}$) layer L1, an indium arsenide (InAs) layer L2, and a gallium arsenide (GaAs) layer L3, where y is an arsenic (As) fraction, y is greater than 0 and less than 1, and y may be 0.45 to 0.6. In this case, $GaAs_y Sb_{1-y}$ layer L1 can be lattice-matched to an InP layer. $GaAs_y Sb_{1-y}$ layer L1, InAs layer L2, and GaAs layer L3 may be stacked in first direction D1. $GaAs_y Sb_{1-y}$ layer L1, InAs layer L2, and GaAs layer L3 may be stacked in this order in first direction D1. In first direction D1, InAs layer L2 may be disposed between $GaAs_y Sb_{1-y}$ layer L1 and GaAs layer L3. Alternatively, $GaAs_y Sb_{1-y}$ layer L1, GaAs layer L3, and InAs layer L2 may be stacked in this order in first direction D1. In first direction D1, GaAs layer L3 may be disposed between $GaAs_y Sb_{1-y}$ layer L1 and InAs layer L2. InAs layer L2 may be in contact with the adjacent GaAs layer L3. $GaAs_y Sb_{1-y}$ layer L1 may be in contact with the adjacent layer (InAs layer L2 or GaAs layer L3). The layer (InAs layer L2 or GaAs layer L3) located at the end in first direction D1 in one unit structure U1 may be in contact with $GaAs_y Sb_{1-y}$ layer L1 in the adjacent unit structure U1. $GaAs_y Sb_{1-y}$ L1 may function as an electron-barrier layer or a hole-well layer. InAs layer L2 and GaAs layer L3 may function as an electronic well layer or a hole barrier layer.

In each unit structure U1, the number of pairs including the single InAs layer L2 and the single GaAs layer L3 is k, and k may be 1 to 10 or may be 2 or more. In this case, InAs layer L2 and GaAs layer L3 may be alternately arranged. InAs layer L2 and GaAs layer L3 may be in contact with each other. As shown in FIG. 3, in each of the k pairs on $GaAs_ySb_{1-y}$ layer L1, InAs layer L2 and GaAs layer L3 may be stacked in this order in first direction D1. Alternatively, in each of the k pairs on $GaAs_ySb_{1-y}$ layer L1, GaAs layer L3 and InAs layer L2 may be stacked in this order in first direction D1.

InAs layer L2 and GaAs layer L3 have smaller thicknesses than $GaAs_ySb_{1-y}$ layer L1. The thickness of InAs layer L2 may be the same as or different from the thickness of GaAs layer L3. $GaAs_ySb_{1-y}$ layer L1 may have a thickness of 2.5 nm to 6.3 nm. InAs layer L2 may have a thickness of 0.2 nm to 1.6 nm. GaAs layer L3 may have a thickness of 0.2 nm to 1.5 nm.

According to semiconductor photodetector 10, InAs layer L2 and GaAs layer L3 in each unit structure U1 function as electronic well layers. In semiconductor photodetector 10, the wavelength of the optical absorption edge (cut-off wavelength) can be made longer than that in the case where the electronic well layer in each unit structure is composed only of a GaInAs layer. This is considered to be because the eigenenergy of the wave function of the conduction band in the electronic well layer is different. Furthermore, according to semiconductor photodetector 10, the average strain amount of each layer in each unit structure U1 can be reduced. The average strain amount of each layer is, for example, about 0.1%.

Various experiments conducted to evaluate unit structure U1 of FIG. 3 will be described below. The experiments described below are not intended to limit the present disclosure.

First Experiment

The optical absorption layer of the semiconductor photodetector according to a first experiment has the following configuration. Each unit structure in the optical absorption layer includes a $GaAs_ySb_{1-y}$ layer having a thickness of 5 nm, where y is 0.52, an InAs layer having a thickness of 0.62 nm, and a GaAs layer having a thickness of 0.56 nm (see FIG. 3), where y is 0.52. The number of pairs including the InAs layer and the GaAs layer is 4. The $GaAs_ySb_{1-y}$ layer functions as an electron-barrier layer. The InAs layer and the GaAs layer function as electron-well layers.

Second Experiment

The optical absorption layer of the semiconductor photodetector according to a second experiment has the following configuration. Each unit structure of the optical absorption layer includes a $GaAs_ySb_{1-y}$ layer having a thickness of 5 nm, where y is 0.51, and a $Ga_xIn_{1-x}As$ layer having a thickness of 5 nm, where x is 0.47. The $GaAs_ySb_{1-y}$ layer functions as an electron-barrier layer. The $Ga_xIn_{1-x}As$ layer functions as an electronic well layer.

First Results of Experiments

For the optical absorption layers of the semiconductor photodetectors according to the first experiment and the second experiment, the band offset energies and the squared value of the absolute value of the magnitudes of the wave functions were calculated by simulation. The results are shown in FIGS. 4 and 5.

Figure 4:
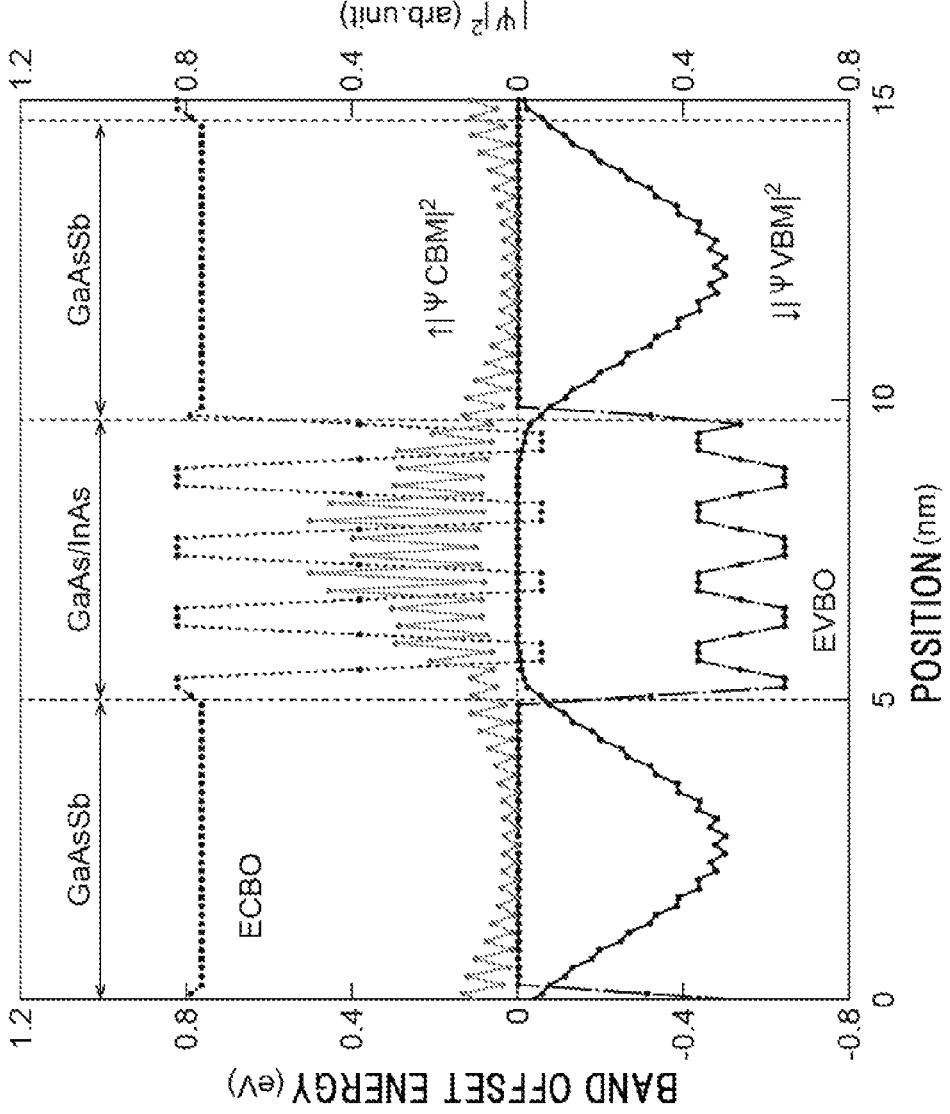
FIG. 4 is a graph illustrating an example of an energy band diagram in an optical absorption layer of a semiconductor photodetector according to a first experiment.
Figure 5:
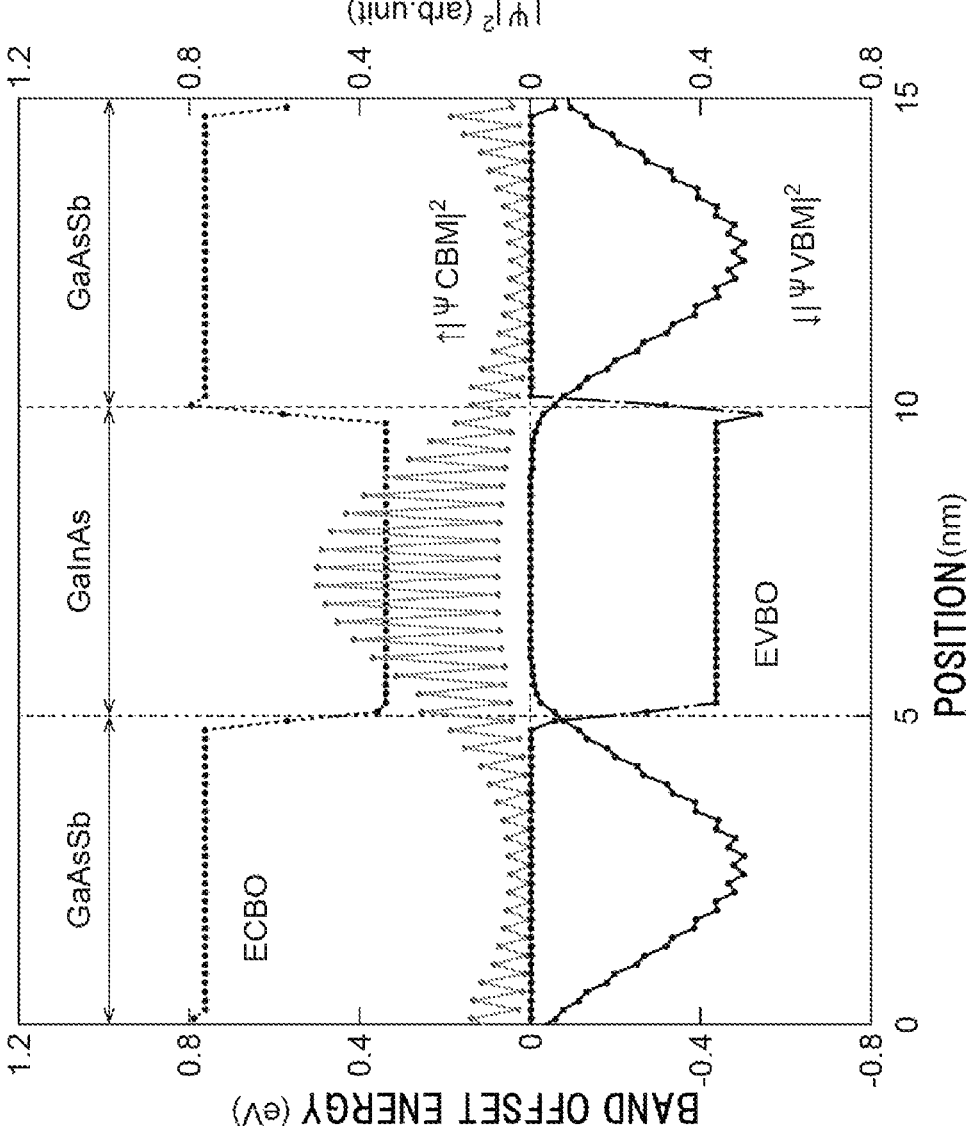
FIG. 5 is a graph illustrating an example of an energy band diagram in an optical absorption layer of a semiconductor photodetector according to a second experiment.

FIGS. 4 and 5 are graphs illustrating examples of energy band diagrams in the optical absorption layer of the semiconductor photodetectors according to the first experiment and the second experiment, respectively. In each graph of FIGS. 4 and 5, the horizontal axis represents the position of each atom in first direction D1. The left vertical axis of the graph represents band offset energy (eV). ECBO represents band offset energy of a conduction band at a F point where a wave number is 0 (also referred to as a conduction band edge). EVBO represents band offset energy of a valence band at a F point where the wave number is 0 (also referred to as a valence band edge). The right vertical axis of the graph represents the squared value of the absolute value of the magnitude of the wave function (arbitrary unit). $|\psi CBM|^2$ represents the squared value of the absolute value of the magnitude of the wave function at the conduction band edge. $|\psi CBM|^2$ is located above the value of 0 on the right vertical axis. $|\psi VBM|^2$ represents the squared value of the absolute value of the magnitude of the wave function at the valence band edge. $|\psi VBM|^2$ is located below the value of 0 on the right vertical axis.

As shown in FIGS. 4 and 5, the energy bands and the wave functions in the electronic well layer are different between the first experiment and the second experiment.

Third Experiment

The optical absorption layer of the semiconductor photodetector according to a third experiment has the following configuration. Each unit structure of the optical absorption layer includes a $GaAs_ySb_{1-y}$ layer having a thickness of 5 nm, where y is 0.53, an InAs layer having a thickness of 1.2 nm, and a GaAs layer having a thickness of 1.1 nm (see FIG. 3). The number of pairs including the InAs layer and the GaAs layer is 2. The $GaAs_ySb_{1-y}$ layer functions as an electron-barrier layer. The InAs layer and the GaAs layer function as electron-well layers.

The $GaAs_ySb_{1-y}$ layer having a thickness of 5 nm includes 17 $GaAs_ySb_{1-y}$ monolayers. The monolayer means a layer containing a single molecule (group III-V compound semiconductor molecule) in the thickness direction. Each $GaAs_ySb_{1-y}$ monolayer is a layer containing a single $GaAs_ySb_{1-y}$ molecule in the thickness direction. The InAs layer having a thickness of 1.2 nm includes four InAs monolayers. Each InAs monolayer is a layer containing a single InAs molecule in the thickness direction. The GaAs layer having a thickness of 1.1 nm includes four GaAs monolayers. Each GaAs monolayer is a layer containing a single GaAs molecule in the thickness direction.

Fourth Experiment

The optical absorption layer of the semiconductor photodetector according to a fourth experiment has the following configuration. Each unit structure of the optical absorption layer includes a $GaAs_ySb_{1-y}$ layer having a thickness of 5 nm, where y is 0.51, and a $Ga_xIn_{1-x}As$ layer having a thickness of 5 nm, where x is 0.47. The $Ga_xIn_{1-x}As$ layer having a thickness of 5 nm includes 17 $Ga_xIn_{1-x}As$ monolayers. The $GaAs_ySb_{1-y}$ layer functions as an electron-barrier layer. The $Ga_xIn_{1-x}As$ layer functions as an electron-well layer.

Second Results of Experiments

For the optical absorption layers of the semiconductor photodetectors according to the third experiment and the fourth experiment, the spectra of the optical absorption coefficients at the operating temperature of 200 K was calculated by simulation. The results are shown in FIG. 6.

Figure 6:
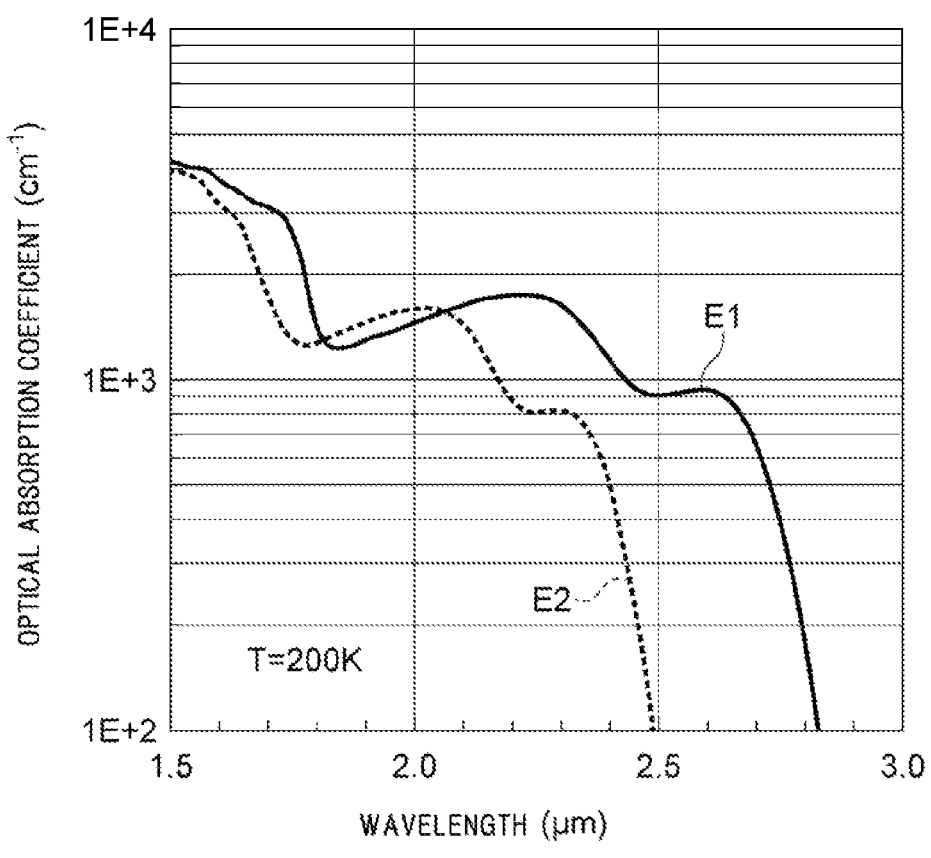
FIG. 6 is a graph illustrating examples of spectra of optical absorption coefficients obtained in a third experiment and a fourth experiment.

FIG. 6 is a graph illustrating examples of spectra of optical absorption coefficients obtained in the third experiment and the fourth experiment. In the graph of FIG. 6, the vertical axis represents the optical absorption coefficient ($cm^{-1}$). The horizontal axis represents the wavelength ($\mu m$). A solid line E1 represents the spectrum obtained for the optical absorption layer of the semiconductor photodetector according to the third experiment. A dashed line E2 represents the spectrum obtained for the optical absorption layer of the semiconductor photodetector according to the fourth experiment.

As shown in FIG. 6, the wavelength of the optical absorption edge of solid line E1 was about 2.8 $\mu m$. The wavelength of the optical absorption edge of dashed line E2 was about 2.5 $\mu m$. In the third experiment, the longer wavelength of the optical absorption edge was obtained as compared with the fourth experiment. Therefore, it can be seen that when the electron-well layer includes the InAs layer and the GaAs layer, the longer wavelength of the optical absorption edge is obtained compared to the case where the electron-well layer is composed only of the GaInAs layer. Furthermore, in the third experiment, it can be seen that a decrease in the optical absorption coefficient is suppressed in a wavelength range of 2.5 $\mu m$ or less.

Hereinafter, a modification of the unit structure included in optical absorption layer 16 will be described.

Figure 7:
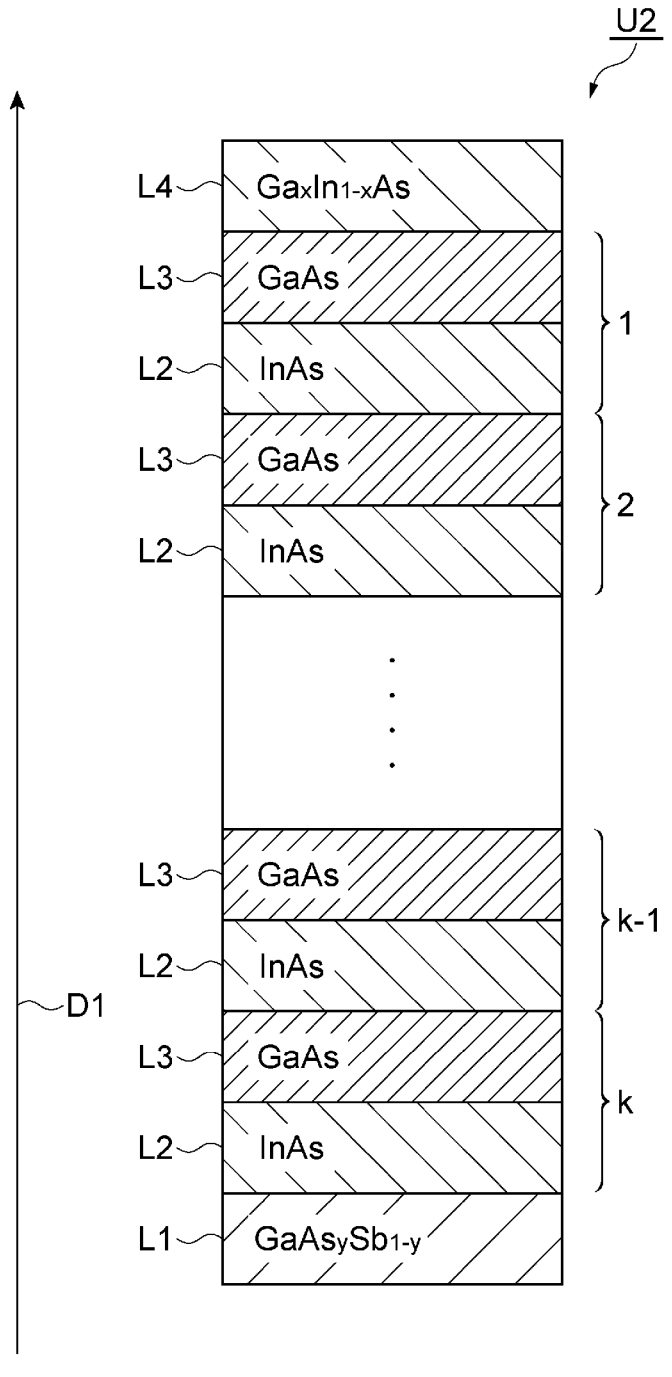
FIG. 7 is a schematic cross-sectional view illustrating a modification of a unit structure included in the optical absorption layer of FIG. 2.

FIG. 7 is a schematic cross-sectional view illustrating a modification of the unit structure included in the optical absorption layer of FIG. 2. A unit structure U2 shown in FIG. 7 may be included in optical absorption layer 16 of FIG. 2 instead of unit structure U1 of FIG. 3. As shown in FIG. 7, unit structure U2 has the same configuration as unit structure U1 except that unit structure U2 further includes a $Ga_xIn_{1-x}As$ layer L4, where x is a Ga fraction, x is greater than 0 and less than 1, and x may be 0.4 to 0.55. InAs layer L2 and GaAs layer L3 are disposed between $GaAs_ySb_{1-y}$ layer L1 and $Ga_xIn_{1-x}As$ layer L4 in first direction D1. $Ga_xIn_{1-x}As$ layer L4 may be in contact with the adjacent layer (InAs layer L2 or GaAs layer L3). $Ga_xIn_{1-x}As$ layer L4 in one unit structure U2 may be in contact with $GaAs_ySb_{1-y}$ layer L1 in the adjacent unit structure U2. $Ga_xIn_{1-x}As$ layer L4 may function as an electron-well layer or a hole-barrier layer together with InAs layer L2 and GaAs layer L3.

$Ga_xIn_{1-x}As$ layer L4 may have a greater thickness than the thicknesses of InAs layer L2 and GaAs layer L3. $Ga_xIn_{1-x}As$ layer L4 may have a smaller thickness than $GaAs_ySb_{1-y}$ layer L1. $Ga_xIn_{1-x}As$ layer L4 may have a thickness of 0.8 nm to 2.1 nm.

According to the semiconductor photodetector including unit structure U2, the wavelength of the optical absorption edge can be lengthened similarly to semiconductor photodetector 10 including unit structure U1. Further, the lattice strain caused by InAs layer L2 and GaAs layer L3 can be canceled by adjusting the Ga fraction x in the $Ga_xIn_{1-x}As$ layer L4. Therefore, the average strain amount of the electron-well layer can be reduced.

Various experiments conducted to evaluate unit structure U2 of FIG. 7 will be described below. The experiments described below are not intended to limit the present disclosure.

Fifth Experiment

The optical absorption layer of the semiconductor photodetector according to a fifth experiment has the following configuration. Each unit structure of the optical absorption layer includes a $GaAs_ySb_{1-y}$ layer having a thickness of 5 nm, where y is 0.51, an InAs layer having a thickness of 0.6 nm, a GaAs layer having a thickness of 0.6 nm and a $Ga_xIn_{1-x}As$ layer having a thickness of 1.5 nm, where x is 0.50 (see FIG. 7). The number of pairs including the InAs layer and the GaAs layer is 3. The $GaAs_ySb_{1-y}$ layer functions as an electron-barrier layer. The InAs layer, the GaAs layer, and the $Ga_xIn_{1-x}As$ layer function as electron-well layers. The InAs layer having a thickness of 0.6 nm includes two InAs monolayers. The GaAs layer having a thickness of 0.6 nm includes two GaAs monolayers. The $Ga_xIn_{1-x}As$ layer having a thickness of 1.5 nm includes five $Ga_xIn_{1-x}As$ monolayers.

Third Results of Experiments

For the optical absorption layers of the semiconductor photodetectors according to the fourth experiment and the fifth experiment, the spectra of the optical absorption coefficients at the operating temperature of 200 K were calculated by simulation. The results are shown in FIG. 8.

Figure 8:
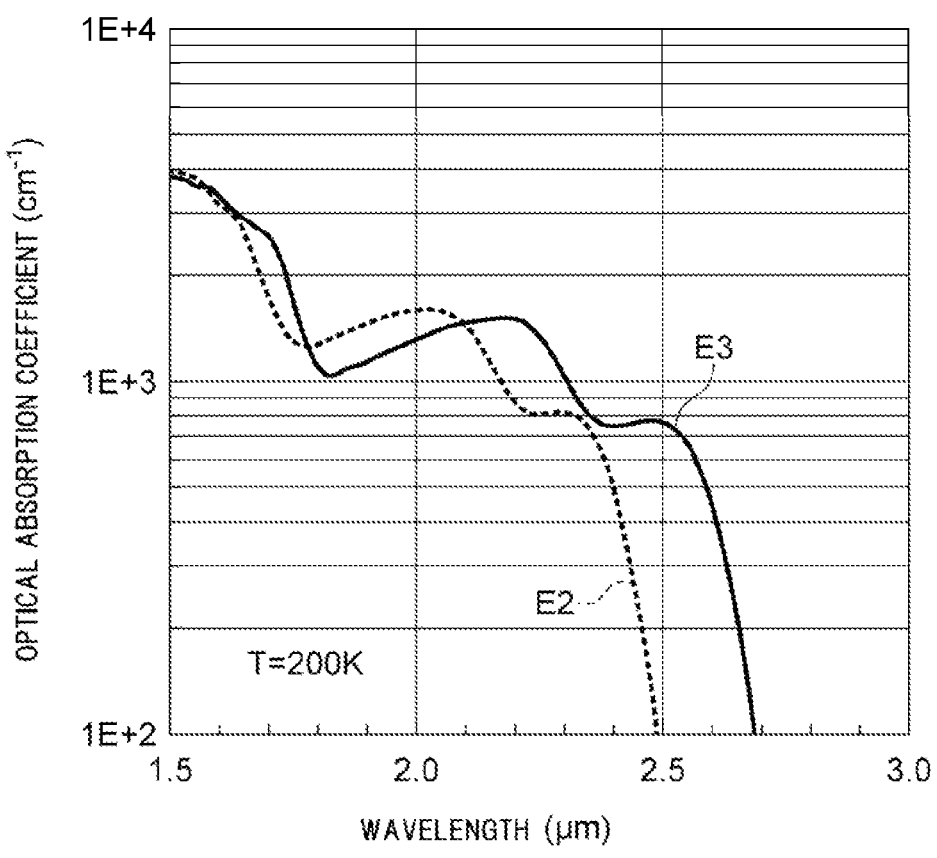
FIG. 8 is a graph illustrating examples of spectra of optical absorption coefficients obtained in the fourth experiment and a fifth experiment.

FIG. 8 is a graph illustrating examples of spectra of optical absorption coefficients obtained in the fourth experiment and the fifth experiment. The axes of the graph of FIG. 8 are the same as the axes of the graph of FIG. 6. A solid line E3 represents the spectrum obtained for the optical absorption layer of the semiconductor photodetector according to the fifth experiment.

As shown in FIG. 8, the wavelength of the optical absorption edge of solid line E3 was about 2.7 $\mu m$. The wavelength of the optical absorption edge of dashed line E2 was about 2.5 $\mu m$. In the fifth experiment, the longer wavelength of the optical absorption edge was obtained as compared with the fourth experiment. Therefore, when the electron-well layer includes the InAs layer, the GaAs layer, and the GaInAs layer, the longer wavelength of the optical absorption edge is obtained as compared with the case where the electron-well layer is composed only pf the GaInAs layer.

Although preferred embodiments of the present disclosure have been described in detail above, the present disclosure is not limited to the above embodiments.

It should be understood that the embodiments disclosed herein are illustrative in all respects and are not restrictive. The scope of the present invention is defined by the appended claims rather than by the foregoing description, and is intended to include all modifications within the scope and meaning equivalent to the appended claims.

What is claimed is:

1. A semiconductor photodetector comprising:
   a first group III-V semiconductor layer of a first conductivity type;
   a second group III-V semiconductor layer of a second conductivity type; and
   an optical absorption layer disposed between the first group III-V semiconductor layer and the second group III-V semiconductor layer in a first direction,
   wherein the optical absorption layer includes a plurality of unit structures stacked in the first direction,
   wherein each of the plurality of unit structures includes a gallium arsenide layer, an indium arsenide layer, and a gallium arsenide antimonide layer,
   wherein the gallium arsenide layer and the indium arsenide layer each have a thickness smaller than a thickness of the gallium arsenide antimonide layer, wherein the gallium arsenide antimonide layer functions as an electron-barrier layer or a hole-well layer, and the gallium arsenide layer and the indium arsenide layer function as an electronic well layer or a hole barrier layer, and wherein the gallium arsenide antimonide layer is in contact with the gallium arsenide layer or the indium arsenide layer within each of the plurality of unit structures.

2. The semiconductor photodetector according to claim 1, wherein each of the plurality of unit structures further includes a gallium indium arsenide layer, and the gallium arsenide layer and the indium arsenide layer are disposed between the gallium indium arsenide layer and the gallium arsenide antimonide layer in the first direction.

3. The semiconductor photodetector according to claim 2, wherein the gallium indium arsenide layer has a gallium fraction of 0.4 to 0.55.

4. The semiconductor photodetector according to claim 2, wherein the gallium indium arsenide layer has a thickness of 0.8 nm to 2.1 nm.

5. The semiconductor photodetector according to claim 1, wherein the gallium arsenide layer has a thickness of 0.2 nm to 1.5 nm.

6. The semiconductor photodetector according to claim 1, wherein the indium arsenide layer has a thickness of 0.2 nm to 1.6 nm.

7. The semiconductor photodetector according to claim 1, wherein the gallium arsenide antimonide layer has a thickness of 2.5 nm to 6.3 nm.

8. The semiconductor photodetector according to claim 1, wherein, in each of the plurality of unit structures, the number of pairs including the gallium arsenide layer and the indium arsenide layer is 1 to 10.

9. The semiconductor photodetector according to claim 1, wherein the gallium arsenide antimonide layer has an arsenic fraction of 0.45 to 0.6.

10. The semiconductor photodetector according to claim 1, further comprising:

an indium phosphide substrate, wherein the first group III-V semiconductor layer is disposed between the indium phosphide substrate and the optical absorption layer in the first direction.

11. The semiconductor photodetector according to claim 1, wherein the number of the plurality of unit structures is 100 to 500.

12. The semiconductor photodetector according to claim 1, wherein the plurality of unit structures constitute a super-lattice.

13. The semiconductor photodetector according to claim 1, wherein, in each of the plurality of unit structures, the indium arsenide layer is disposed between the gallium arsenide antimonide layer and the gallium arsenide layer in the first direction.

14. The semiconductor photodetector according to claim 1, wherein the optical absorption layer has an optical absorption edge wavelength of 2.5 μm or more.

* * * * *